US009105503B2

(12) United States Patent
Kim et al.

(10) Patent No.: US 9,105,503 B2
(45) Date of Patent: Aug. 11, 2015

(54) PACKAGE-ON-PACKAGE DEVICE

(71) Applicants: Yonghoon Kim, Suwon-si (KR); Hyo-Soon Kang, Seoul (KR); Inho Choi, Seoul (KR)

(72) Inventors: Yonghoon Kim, Suwon-si (KR); Hyo-Soon Kang, Seoul (KR); Inho Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/047,120

(22) Filed: Oct. 7, 2013

(65) Prior Publication Data

US 2014/0217586 A1    Aug. 7, 2014

(30) Foreign Application Priority Data

Feb. 1, 2013    (KR) .................. 10-2013-0011940

(51) Int. Cl.
| | |
|---|---|
| H01L 23/48 | (2006.01) |
| H01L 25/10 | (2006.01) |
| H01L 23/31 | (2006.01) |
| H01L 25/065 | (2006.01) |
| H01L 25/18 | (2006.01) |

(52) U.S. Cl.
CPC ........... *H01L 25/105* (2013.01); *H01L 23/3128* (2013.01); *H01L 25/0655* (2013.01); *H01L 25/0657* (2013.01); *H01L 25/18* (2013.01); *H01L 2224/0401* (2013.01); *H01L 2224/04042* (2013.01); *H01L 2224/06135* (2013.01); *H01L 2224/16225* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2225/0651* (2013.01); *H01L 2225/06565* (2013.01); *H01L 2225/1023* (2013.01); *H01L 2225/1058* (2013.01); *H01L 2924/15192* (2013.01); *H01L 2924/15311* (2013.01); *H01L 2924/15331* (2013.01)

(58) Field of Classification Search
CPC .................. H01L 23/49816; H01L 23/3128; H01L 23/49838; H01L 23/48; H01L 25/042; H01L 25/043; H01L 25/0655; H01L 25/0657
USPC ......... 257/686, 692, 777, 778, 779, 787, 788, 257/E25.013; 438/109, 110, 112, 126, 127, 438/613
See application file for complete search history.

(56) References Cited

U.S. PATENT DOCUMENTS

| | | | |
|---|---|---|---|
| 5,319,600 | A | 6/1994 | Harada |
| 6,658,639 | B2 | 12/2003 | Morooka |
| 6,885,208 | B2 | 4/2005 | Miyatake et al. |
| 7,054,225 | B2 | 5/2006 | Suzu |
| 7,215,033 | B2 | 5/2007 | Lee et al. |
| 7,334,150 | B2 | 2/2008 | Ruckerbauer et al. |

(Continued)

FOREIGN PATENT DOCUMENTS

JP    2011-222807 A    11/2011

*Primary Examiner* — Khiem D Nguyen
(74) *Attorney, Agent, or Firm* — Harness, Dickey & Pierce, P.L.C.

(57) ABSTRACT

A package-on-package device includes memory chips side-by-side on a package substrate. Accordingly, it is possible to reduce a thickness of a semiconductor package. Further, data and command pads of a logic chip may be located to be adjacent to data and command pads of the memory chips. Accordingly, a routing distance between pads can be contracted and thus signal delivery speed can be improved. This makes it possible to improve an operation speed of the device.

19 Claims, 15 Drawing Sheets

(56) References Cited

U.S. PATENT DOCUMENTS

| | | |
|---|---|---|
| 8,125,066 B1 * | 2/2012 | Kang ............................ 257/686 |
| 2002/0026623 A1 | 2/2002 | Morooka |
| 2003/0047731 A1 | 3/2003 | Miyatake et al. |
| 2004/0032779 A1 | 2/2004 | Suzu |
| 2005/0104181 A1 | 5/2005 | Lee et al. |
| 2006/0123265 A1 | 6/2006 | Ruckerbauer et al. |
| 2008/0298147 A1 | 12/2008 | Matsui |
| 2009/0008799 A1 | 1/2009 | Lee et al. |
| 2010/0046266 A1 * | 2/2010 | Bruennert et al. .............. 365/51 |
| 2010/0255614 A1 * | 10/2010 | Uchida ........................... 438/15 |
| 2011/0018129 A1 | 1/2011 | Suzuki et al. |
| 2011/0210433 A1 | 9/2011 | Cho et al. |
| 2011/0227209 A1 * | 9/2011 | Yoon et al. ..................... 257/686 |
| 2012/0217642 A1 * | 8/2012 | Sun et al. ....................... 257/773 |
| 2013/0049224 A1 * | 2/2013 | Sutardja ........................ 257/774 |
| 2013/0326188 A1 * | 12/2013 | Suh et al. ...................... 711/206 |

\* cited by examiner

PACKAGE-ON-PACKAGE DEVICE

CROSS-REFERENCE TO RELATED APPLICATIONS

This U.S. non-provisional patent application claims priority under 35 U.S.C. §119 to Korean Patent Application No. 10-2013-0011940, filed on Feb. 1, 2013, in the Korean Intellectual Property Office, the entire contents of which are hereby incorporated by reference.

BACKGROUND

Example embodiments of inventive concepts relate to a package-on-package device. High-performance, high-speed and compact electronic systems are seeing increasing demand as the electronic industry matures. In response to such a demand, various semiconductor packaging techniques have been proposed. For example, methods have been suggested for stacking a plurality of semiconductor chips on a semiconductor substrate within a single package. Further, methods have been suggested for stacking a plurality of such packages to produce a so-called "package-on-package (PoP)" device. In particular, for the PoP device, a plurality of semiconductor chips or integrated circuits (ICs) may be provided in each package. This may increase the size, e.g. the width and/or length and/or thickness of the PoP device: Further, signal interconnection routing becomes more complex. Moreover, increased lengths of interconnection lines may result in decreasing signal-quality and/or power-delivery property of the device.

SUMMARY

Example embodiments of inventive concepts provide a package-on-package device having a reduced thickness and an increased speed.

According to example embodiments of inventive concepts, a package-on-package device may include a first semiconductor package including a first package substrate and a logic chip on the first package substrate, and a second semiconductor package on the first semiconductor package, the second semiconductor package including a second package substrate and first and second memory chips mounted side-by-side on the second package substrate. The logic chip may include first and second data logic pads electrically connected to the first and second memory chips, respectively, and the first and second data logic pads may be adjacent to one sidewall or opposite two sidewalls of the logic chip.

In example embodiments, the first and second memory chips further include first and second data memory pads corresponding to the first and second data logic pads, respectively, and the first and second data memory pads may be on same sides of the device as the first and second data logic pads, respectively.

In example embodiments, the logic chip may further include first and second command logic pads electrically connected to the first and second memory chips, respectively, and the first and second command logic pads may be adjacent to a second sidewall of the logic chip or at a center of the logic chip, where the first and second data logic pads may be adjacent to a first sidewall of the logic chip and the second sidewall may be a sidewall of the logic chip facing the first sidewall.

In example embodiments, the first and second memory chips further include first and second command memory pads corresponding to the first and second command logic pads, respectively, and the first and second command memory pads may be on same sides of the device as the first and second command logic pads, respectively.

In example embodiments, the device may further include first and second command solder balls between the first and second package substrates to connect the first and second command logic pads electrically to the first and second command memory pads, respectively. The first and second command solder balls may be on same sides of the device as the first and second command logic pads, respectively.

In example embodiments, the device may further include first and second data solder balls between the first and second package substrates to connect the first and second data logic pads electrically to the first and second data memory pads, respectively. The first and second data solder balls may be on same sides of the device as the first and second data logic pads, respectively.

In example embodiments, the first package substrate may include a first package sidewall adjacent to the first data solder balls, a second package sidewall adjacent to the first command solder balls, the first and second package sidewalls facing each other, and third and fourth package sidewalls facing each other and connecting the first and second package sidewalls to each other. A number of solder balls adjacent to the first and second package sidewalls may be smaller than a number of solder balls adjacent to the third and fourth package sidewalls.

In example embodiments, a number of the command solder balls may be equivalent to or smaller than a number of the data solder balls.

In example embodiments, the first and second memory chips may be of the same kind.

In example embodiments, the device may further include third and fourth memory chips on the first and second memory chips, respectively. The third and fourth memory chips may be of the same kind as the first and second chips, and sidewalls of the third and fourth memory chips may be vertically aligned to those of the first and second memory chips, respectively.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
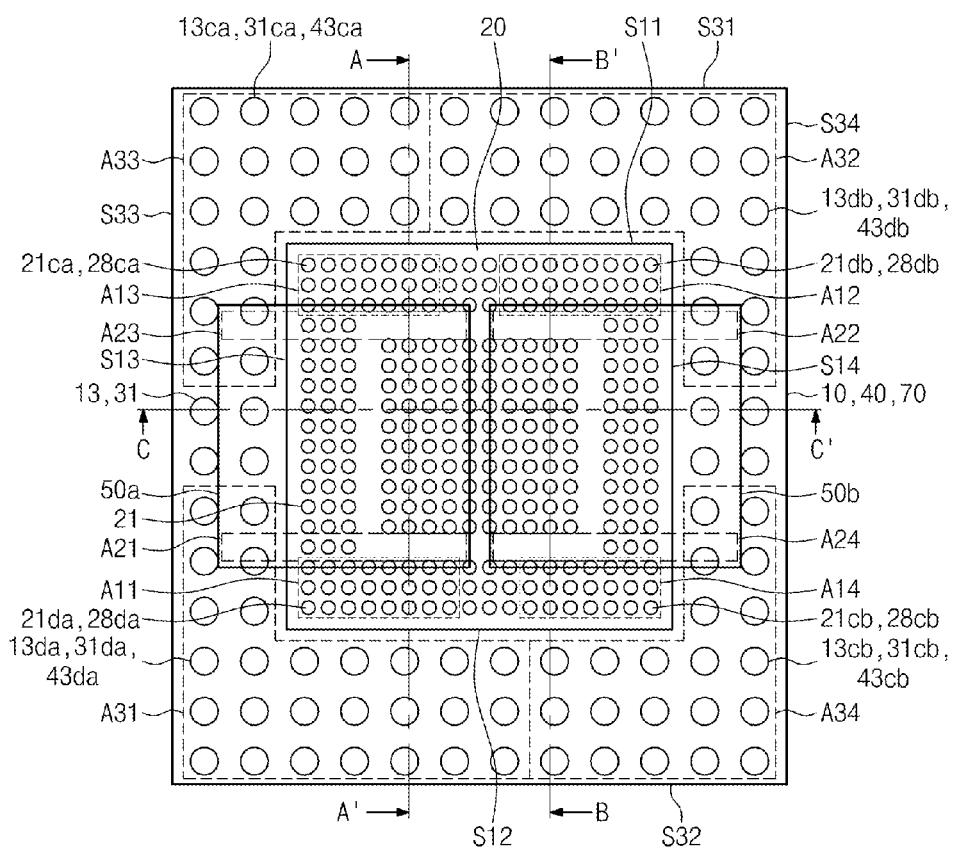
FIG. 1 is a plan view of a package-on-package device according to example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
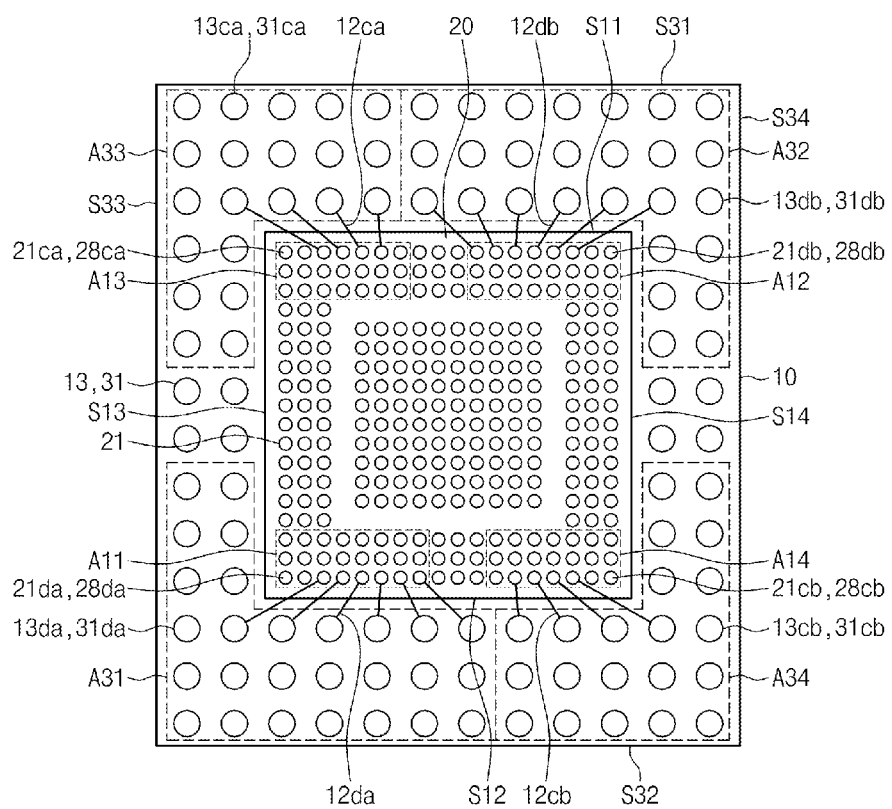
FIG. 2 is a plan view illustrating a first semiconductor package of FIG. 1.
Figure 3:
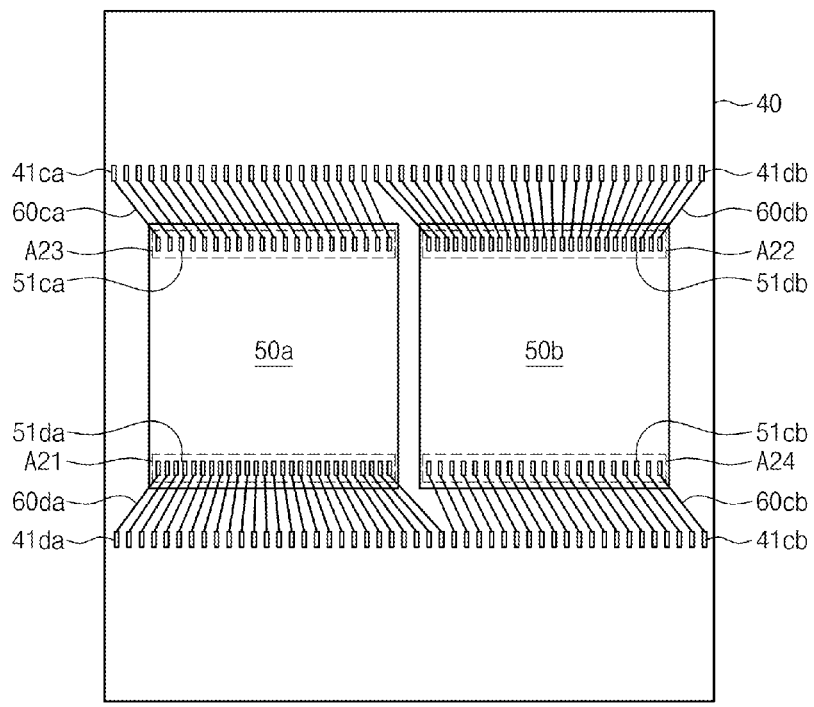
FIG. 3 is a plan view illustrating a second semiconductor package of FIG. 2.
Figure 4A:
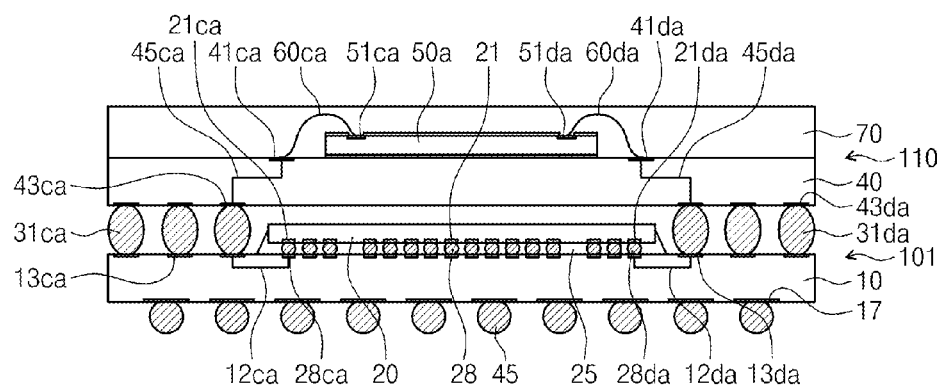
FIGS. 4A through 4C are sectional views taken along lines A-A', B-B', and C-C', respectively, of FIG. 1.
Figure 4B:
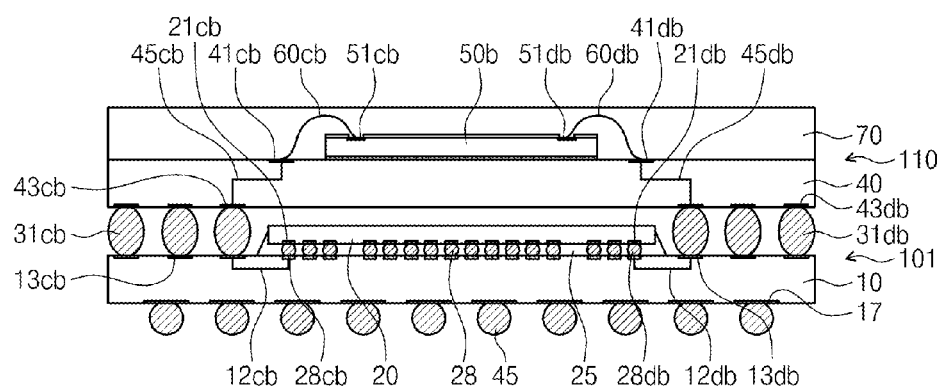
Figure 4C:
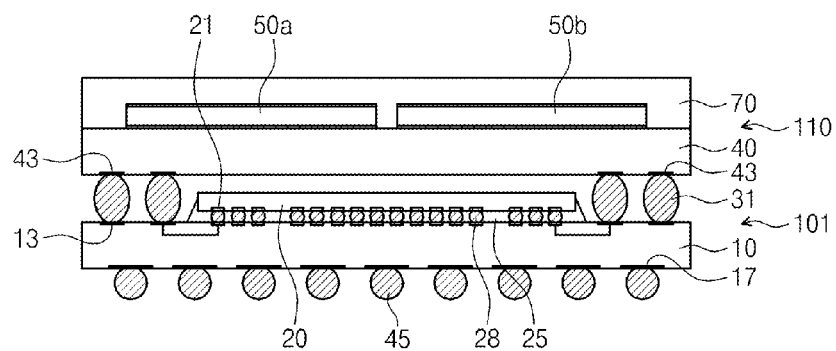

FIG. 1 is a plan view of a package-on-package device according to example embodiments of inventive concepts. FIG. 2 is a plan view illustrating a first semiconductor package of FIG. 1. FIG. 3 is a plan view illustrating a second semiconductor package of FIG. 2. FIGS. 4A through 4C are sectional views taken along lines A-A', B-B', and C-C', respectively, of FIG. 1.

Referring to FIGS. 1 through 3 and 4A through 4C, a package-on-package device according to example embodiments of inventive concepts, a second semiconductor package 110 may be mounted on a first semiconductor package 101. The first semiconductor package 101 may include a logic chip 20 mounted on a first package substrate 10. The second semiconductor package 110 may include a plurality of memory chips 50a and 50b mounted side-by-side on a second package substrate 40. Accordingly, the second semiconductor package 110 can have a reduced thickness. The memory chips 50a and 50b may be referred to as a first memory chip 50a and a second memory chip 50b and may be of the same kind.

The logic chip 20 may include an eleventh region A11, a twelfth region A12, a thirteenth region A13, and a fourteenth region A14. First and second logic pads 21da and 21db may be provided on the eleventh and twelfth regions A11 and A12, respectively, of the logic chip 20 to send/receive data signals to/from the first and second memory chips 50a and 50b. Third and fourth logic pads 21ca and 21cb may be provided on the thirteenth and fourteenth regions A13 and A14, respectively, of the logic chip 20 to send/receive command or access signals to/from the first and second memory chips 50a and 50b. The logic chip 20 may further include logic pads 21, which may not be connected to the memory chips 50a and 50b. The logic chip 20 may include eleventh to fourteenth sidewalls S11, S12, S13, and S14. The thirteenth and twelfth regions A13 and A12 may be disposed adjacent to the eleventh sidewall S11, and the eleventh and fourteenth regions A11 and A14 may be disposed adjacent to the twelfth sidewall S12 facing the eleventh sidewall S11. In example embodiments, the thirteenth region A13 may have substantially the same area as the fourteenth region A14. The eleventh region A11 may have substantially the same area as the twelfth region A12. The thirteenth region A13 may have an area that is smaller than that of the eleventh region 11. Further, the number of the third or fourth logic pads 21ca or 21cb may be smaller than that of the first or second logic pads 21da or 21db.

Internal solder balls 28, 28da, 28db, 28ca, and 28cb may be attached to the logic pads 21, 21ca, 21cb, 21da, and 21db, and the logic chip 20 may be mounted on the first package substrate 10, in a flip-chip bonding manner, by the internal solder balls 28, 28da, 28db, 28ca, and 28cb. An underfill resin layer 25 may be provided to fill a gap between the logic chip 20 and the first package substrate 10. Upper ball lands 13, 13da, 13db, 13ca, and 13cb may be provided around the logic chip 20 and on a top surface of the first package substrate 10, and outer ball lands 17 may be provided on a bottom surface of the first package substrate 10. Outer solder balls 45 may be attached to the outer ball lands 17. Eleventh to fourteenth internal lines 45da, 45db, 45ca, and 45cb may be provided in the first package substrate 10.

The first and second memory chips 50a and 50b may include twenty-first and twenty-second regions A21 and A22, respectively. The twenty-first and twenty-second regions A21 and A22 may include first and second memory pads 51da and 51db, respectively, which are electrically connected to the first and second logic pads 21da and 21db. The first and second memory pads 51da and 51db may serve as data/O pads of the first and second memory chips 50a and 50b, respectively. The first and second memory chips 50a and 50b may include twenty-third and the twenty-fourth regions A23 and A24, respectively. The twenty-third and the twenty-fourth regions A23 and A24 may include third and fourth memory pads 51ca and 51cb, respectively, which are electrically connected to the third and fourth logic pads 21ca and 21cb. The third and fourth memory pads 51ca and 51cb may serve as command/access I/O pads of the first and second memory chips 50a and 50b, respectively.

In the present embodiment, the first memory chip 50a may be configured in such a way that the twenty-third region A23 for the command/access I/O pads 51ca is located adjacent to the eleventh sidewall S11 and the twenty-first region A21 for the data I/O pads 51da is located adjacent to the twelfth sidewall S12. By contrast, the second memory chip 50b may be configured in such a way that the twenty-second region A22 for the data I/O pads 51db is located adjacent to the eleventh sidewall S11 and the twenty-fourth region A24 for the command/access I/O pads 51cb is located adjacent to the eleventh sidewall S12.

The memory chips 50a and 50b may be mounted on the second package substrate 40 and they may be connected to each other, in a wire-bonding manner, by the first to fourth wires 60da, 60db, 60ca, and 60cb. First to fourth conductive patterns 41da, 41db, 41ca, and 41cb may be provided on the second package substrate 40, and the wires 60da, 60db, 60ca, and 60cb may be attached to the first to fourth conductive patterns 41da, 41db, 41ca, and 41cb, respectively. First to fourth lower ball lands 43da, 43db, 43ca, and 43cb may be provided on the bottom surface of the second package substrate 40. The memory chips 50a and 50b may be covered with a mold layer 70. Twenty-first to twenty-fourth internal lines 12da, 12db, 12ca, and 12cb may be provided in the first package substrate 10.

The first package substrate 10 and the second package substrate 40 may be electrically connected to each other by connection solder balls 31, 31da, 31db, 31ca, and 31cb. The first package substrate 10 may include a thirty-first region A31, a thirty-second region A32, a thirty-third region A33, and a thirty-fourth region A34. The first and second connection solder balls 31da and 31db may be provided on the thirty-first and thirty-second regions A31 and A32, respectively, and the third and fourth connection solder balls 31ca and 31cb may be provided on the thirty-third and thirty-fourth regions A33 and A34, respectively. The first package substrate 10 may include thirty-first to thirty-fourth sidewalls S31, S32, S33, and S34 that are adjacent to the eleventh to fourteenth sidewalls S11, S12, S13, and S14, respectively. The number of the connection solder balls 31da, 31db, 31ca, and 31cb may be greater at a region adjacent to the thirty-first or thirty-second sidewall S31 and S32 than at other region adjacent to the thirty-third or thirty-fourth sidewall S33 and S34. For example, the connection solder balls 31da, 31db, 31ca, and 31cb adjacent to the thirty-first or thirty-second sidewall S31 and S32 may be arranged in three columns, while the connection solder balls 31, 31da, 31db, 31ca, and 31cb adjacent to the thirty-third or thirty-fourth sidewall S33 and S34 may be arranged in two columns.

The eleventh, twenty-first, and thirty-first regions A11, A21, and A31 may be disposed adjacent to each other, while the twelfth, twenty-second, and thirty-second regions A12, A22, and A32 may be disposed adjacent to each other. The thirteenth, twenty-third, and thirty-third regions A13, A23, and A33 may be disposed adjacent to each other, while the fourteenth, twenty-fourth, and thirty-fourth regions A14, A24, and A34 may be disposed adjacent to each other.

For example, the first logic pad 21da may be electrically connected to the first memory pad 51da via, for example, the first internal solder ball 28da, the eleventh internal line 12da, the first upper ball land 13da, the first connection solder ball 31da, the first lower ball land 43da, the eleventh internal line 45da, the first conductive pattern 41da, and the first wire 60da, to send/receive data signals to/from the first memory chip 50a.

The second logic pad 21db may be electrically connected to the second memory pad 51db via, for example, the second internal solder ball 28db, the twelfth internal line 12db, the second upper ball land 13db, the second connection solder ball 31db, the second lower ball land 43db, the twelfth line

45db, the second conductive pattern 41db, and the second wire 60db, to send/receive data signals to/from the second memory chip 50b.

The third logic pad 21ca may be electrically connected to the third memory pad 51ca via, for example, the third internal solder ball 28ca, the thirteenth internal line 12ca, the third upper ball land 13ca, the third connection solder ball 31ca, the third lower ball land 43ca, the thirteenth internal line 45ca, the third conductive pattern 41ca, and the third wire 60ca, to send/receive command/access signals to/from the first memory chip 50a.

The fourth logic pad 21cb may be electrically connected to the fourth memory pad 51cb via, for example, the fourth internal solder ball 28cb, the fourteenth internal line 12cb, the fourth upper ball land 13cb, the fourth connection solder ball 31cb, the fourth lower ball land 43cb, the fourteenth internal line 45cb, the fourth conductive pattern 41cb, and the fourth wire 60cb, to send/receive command/access signals to/from the second memory chip 50b.

According to example embodiments of inventive concepts, the memory chips 50a and 50b may be arranged side-by-side on the package substrate, and this makes it possible to reduce a thickness of a package-on-package device. Further, positions or disposition of I/O pads of the logic chip may be changed to be suitable for or adjacent to the I/O pads of the memory chips 50a and 50b. Accordingly, a routing distance between pads configured to perform the same function can be contracted, and thus, a signal delivery speed can be improved.

Although not shown, a central processing unit (CPU), a physical layer region and/or a controller may be provided in the logic chip 20. The memory chips 50a and 50b may be configured to support at least one of, for example, LPDDR1, LPDDR2, LPDDR3, and LPDDR3E.

Figure 5:
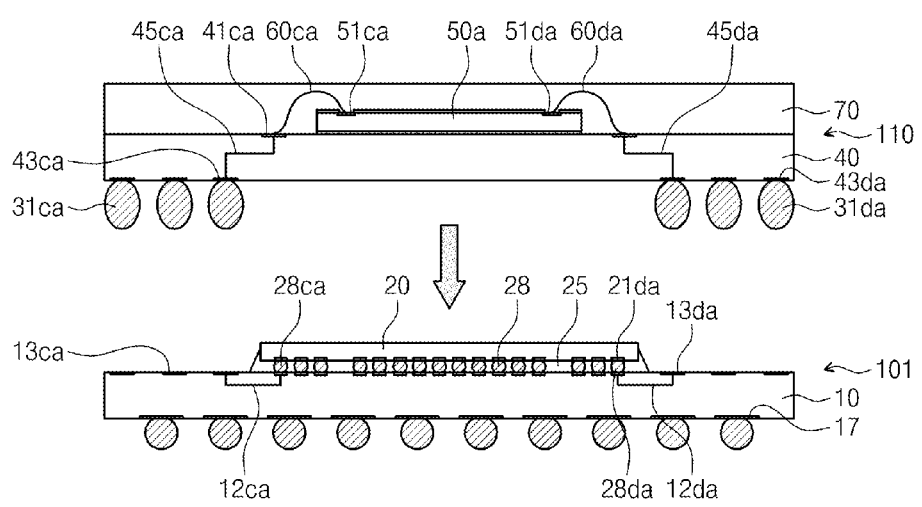
FIG. 5 is a sectional view illustrating a process of fabricating a package-on-package device, whose section is shaped like that of FIG. 4A.

FIG. 5 is a sectional view illustrating a process of fabricating a package-on-package device, whose section is shaped like that of FIG. 4A.

Referring to FIG. 5, the logic chip 20 may be mounted on the first package substrate 10, in a flip-chip bonding manner. An underfill resin solution may be provided under the logic chip 20, and due to a capillary effect, the underfill resin solution may flow in between the logic chip 20 and the first package substrate 10. The underfill resin solution may be cured to form the underfill resin layer 25. Accordingly, the formation of the first semiconductor package 101 may be completed. The memory chips 50a and 50b may be mounted side-by-side on the second package substrate 40 in a wire-bonding manner, and then, the mold layer 70 may be formed thereon. The connection solder balls 31, 31da, 31db, 31ca, and 31cb may be attached on the bottom surface of the second package substrate 40. Accordingly, the formation of the second semiconductor package 110 may be completed. The second semiconductor package 110 may be located on the first semiconductor package 101, and then, they may be heated to weld the connection solder balls 31, 31da, 31db, 31ca, and 31cb to the upper ball lands 13, 13da, 13db, 13ca, and 13cb, respectively. Accordingly, the formation of the package-on-package device according to example embodiments of inventive concepts may be completed.

FIGS. 6 through 9 and FIG. 11 are plan views of a package-on-package device according to other example embodiments of inventive concepts. FIG. 10 is a sectional view taken along a line A-A' of FIG. 9.

Figure 6:
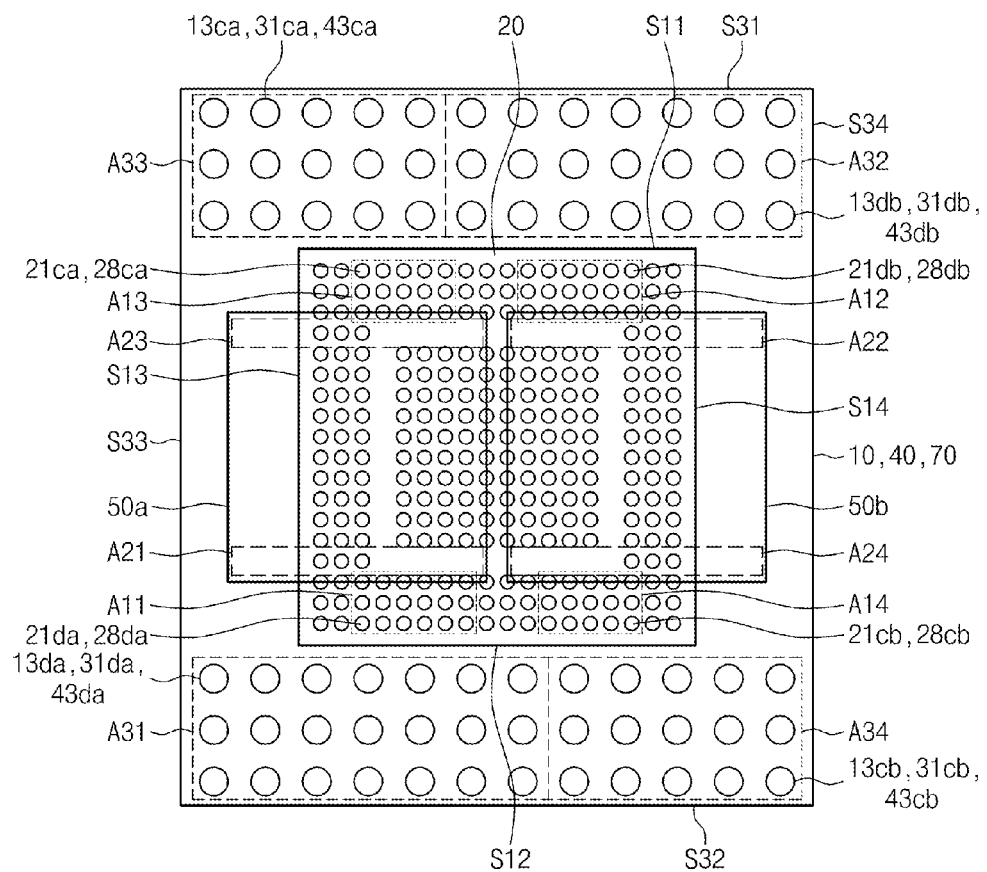
FIGS. 6 through 9 and FIG. 11 are plan views of a package-on-package device according to other example embodiments of inventive concepts.

Referring to FIG. 6, in the package-on-package device, there is no row of the connection solder balls 13, 13da, 13db, 13ca, and 13cb to be provided at a region adjacent to the thirty-third and thirty-fourth sidewalls S33 and S34 of the first package substrate 10. For example, the connection solder balls 13, 13da, 13db, 13ca, and 13cb may not be provided between the thirteenth sidewall S13 of the logic chip 20 and the thirty-third sidewall S33 of the first package substrate 10 and between the fourteenth sidewall S14 of the logic chip 20 and the thirty-fourth sidewall S34 of the first package substrate 10. The package-on-package device may have this configuration, when the connection solder balls 13, 13da, 13db, 13ca, and 13cb adjacent to each of the thirty-first and thirty-second sidewalls S31 and S32 of the first package substrate 10 may form at least three rows. Except for this difference, the device may be configured to have substantially the same structure as that described with reference to FIGS. 1 through 3 and FIGS. 4A through 4C.

To reduce complexity in the drawings and to provide better understanding of example embodiments of inventive concepts, solder balls or pads are not shown in the plan views of FIGS. 7 through 9 and FIG. 11, but they may be provided to have substantially the same configuration as that of FIG. 1 or 6.

Figure 7:
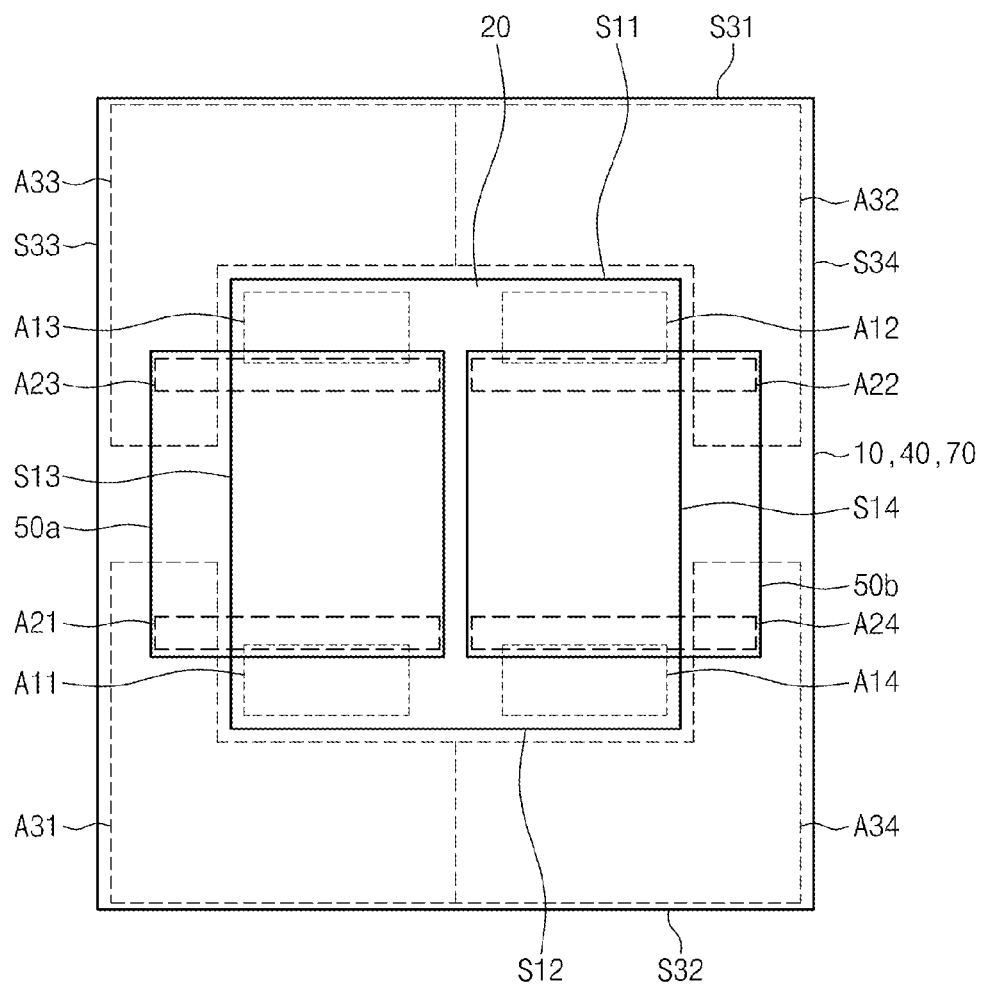

Referring to FIG. 7, the eleventh to fourteenth regions A11-A14 of the logic chip 20 may have substantially the same area. Further, the thirty-first to thirty-fourth regions A31-A34 of the first package substrate 10 may have substantially the same area. Accordingly, the number of pads or solder balls to be provided on each region may be substantially the same. Except for this difference, the device may be configured to have substantially the same structure as that described with reference to FIGS. 1 through 3 and FIGS. 4A through 4C.

Figure 8:
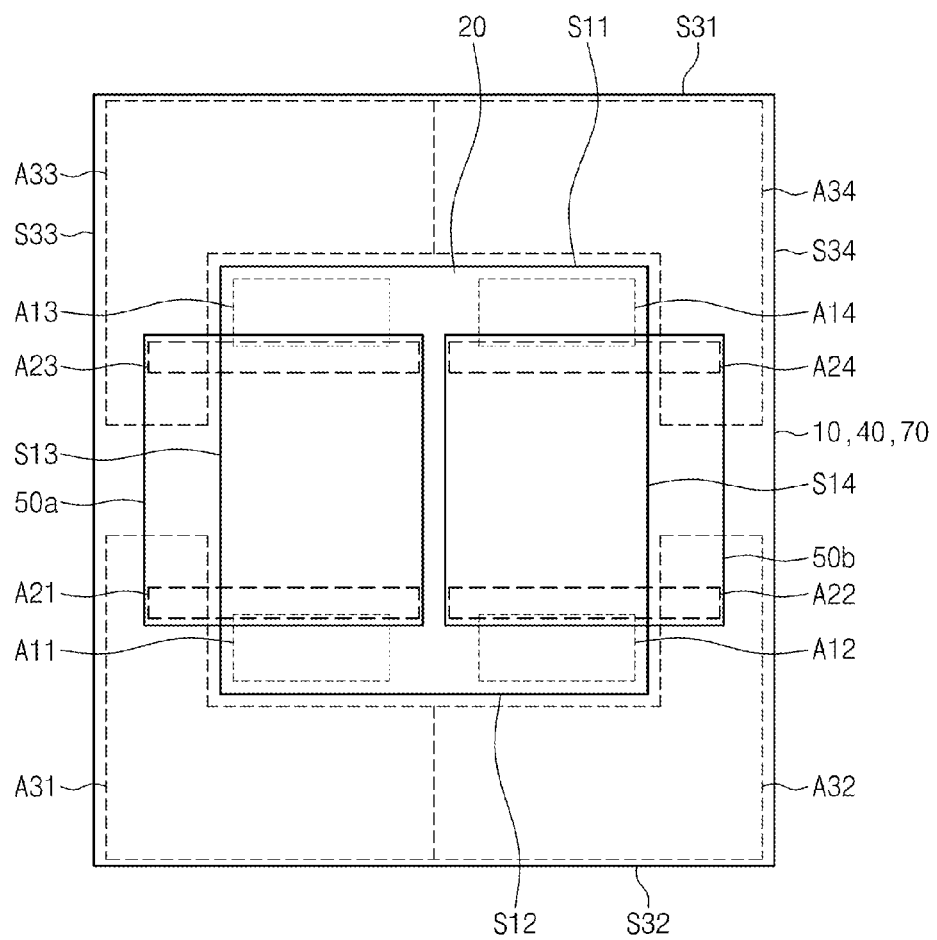

Referring to FIG. 8, the second memory chip 50b may be disposed in a different or opposite manner from that of FIG. 7. The second memory chip 50b may be disposed in the same manner as that of the first memory chip 50a. Accordingly, the twenty-second region A22 and the twenty-fourth region A24 may be disposed in an opposite manner from that of FIG. 7. The twelfth, twenty-second, and thirty-second regions A12, A22, and A32 may be disposed adjacent to the thirty-second sidewall S32, and the fourteenth, twenty-fourth, and thirty-fourth regions A14, A24, and A34 may be disposed adjacent to the thirty-first sidewall S31. Except for this difference, the device may be configured to have substantially the same structure as that described with reference to FIG. 7.

Figure 9:
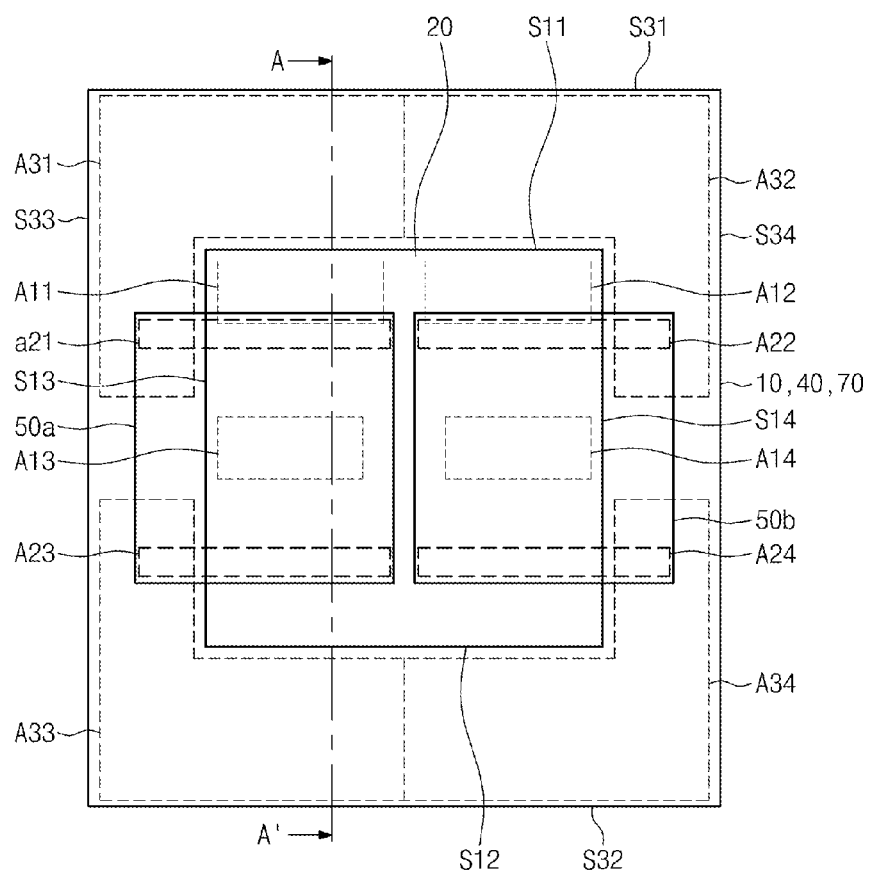
Figure 10:
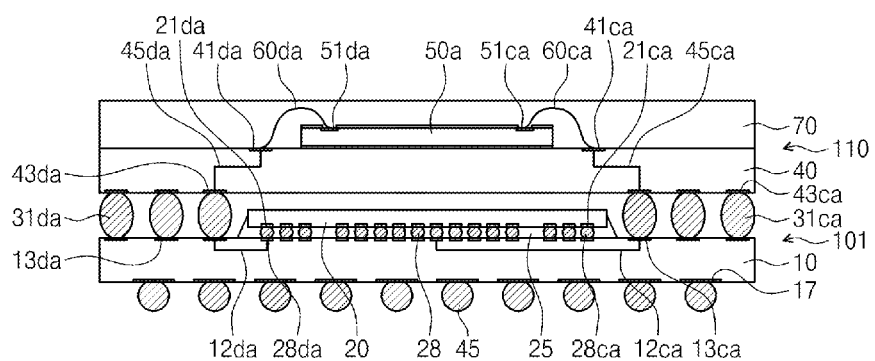
FIG. 10 is a sectional view taken along a line A-A' of FIG. 9.

Referring to FIGS. 9 and 10, the thirteenth region A13 and the fourteenth region A14 of the logic chip 20 may be disposed adjacent to the central region of the logic chip 20. The eleventh and twelfth regions A11 and A12 may be disposed adjacent to the eleventh sidewall S11 of the logic chip 20. All of the eleventh, twenty-first, and thirty-first regions A11, A21, and A31 and the twelfth, twenty-second, and thirty-second regions A12, A22, and A32 may be disposed adjacent to the eleventh sidewall S11. The twenty-third and thirty-third regions A23 and A33 and the twenty-fourth and thirty-fourth regions A24 and A34 may be disposed adjacent to the twelfth sidewall S12. Since the thirteenth region A13 and the fourteenth region A14 are located near the central region of the logic chip 20, the thirteenth and fourteenth internal lines 12ca and 12cb in the first package substrate 10 may have an increased length, compared with the device described with reference to FIGS. 4A and 4B. Except for this difference, the device may be configured to have substantially the same or similar structure as that described with reference to FIG. 7.

Figure 11:
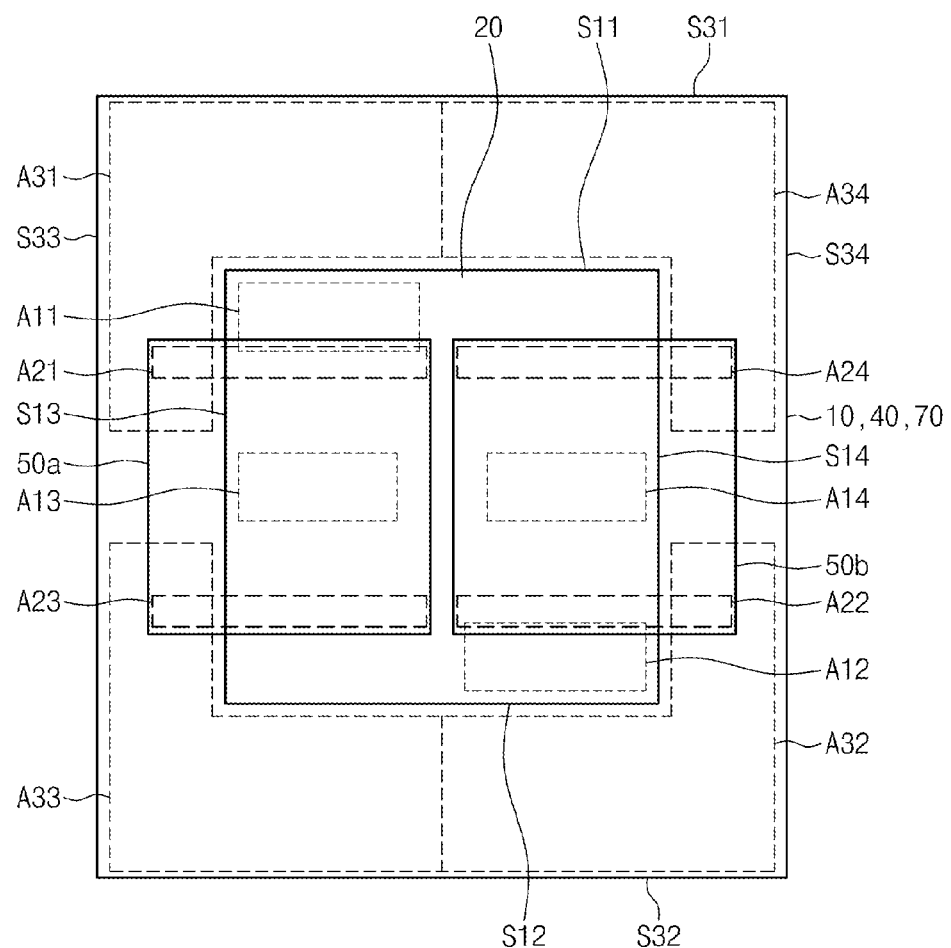

Referring to FIG. 11, the thirteenth region A13 and the fourteenth region A14 may be disposed adjacent to the central region of the logic chip 20, as described with reference to FIGS. 9 and 10. However, the eleventh, twenty-first, thirty-first, twenty-fourth, and thirty-fourth regions A11, A21, A31, A24, and A34 may be disposed adjacent to the eleventh sidewall S11, and the twelfth, twenty-second, thirty-second, twenty-third, and thirty-third regions A12, A22, A32, A23, and A33 may be disposed adjacent to the twelfth sidewall S12. Except for this difference, the device may be configured to have substantially the same or similar structure as that described with reference to FIGS. 9 and 10.

Figure 12A:
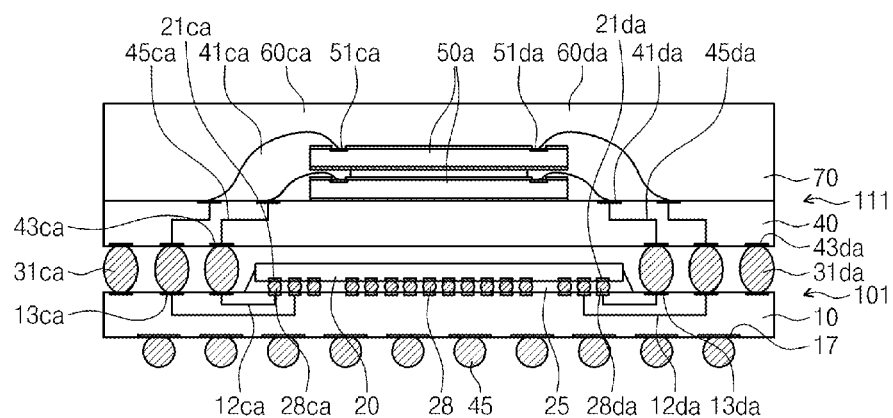
FIGS. 12A and 12B are sectional views taken along lines A-A' and C-C', respectively, of FIG. 1, according to other example embodiments of inventive concepts.
Figure 12B:
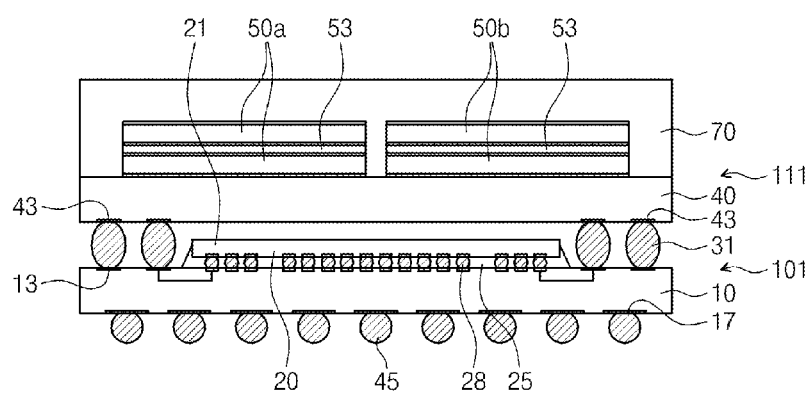

FIGS. 12A and 12B are sectional views taken along lines A-A' and C-C', respectively, of FIG. 1, according to other example embodiments of inventive concepts.

Referring to FIGS. 12A and 12B, a second semiconductor package 111 may include at least two chip layers stacked on the second package substrate 40. Each of the chip layers may include the first memory chip 50a and the second memory chip 50b provided side-by-side on the second package substrate 40. An adhesive supporting layer 53 may be provided between the chip layers (i.e., between the first memory chips 50a and between the second memory chips 50b). The first memory chips 50a of the chip layers may be provided to have an aligned sidewall, and the second memory chips 50b of the chip layers may be provided to an aligned sidewall. Except for this difference, the device may be configured to have substantially the same or similar structure as that described with reference to FIGS. 1 through 4C.

Although not shown, each semiconductor package in the package-on-package device may include a plurality of semiconductor chips mounted in one of several manners. For example, the logic chip 20 may be mounted on the first package substrate 10 in a wire-bonding manner. In addition, the memory chips 50a and 50b may be mounted side-by-side on the second package substrate 40 in a flip-chip bonding manner.

The afore-described semiconductor package techniques may be applied to realize various semiconductor devices and/or various package modules with the semiconductor device.

Figure 13:
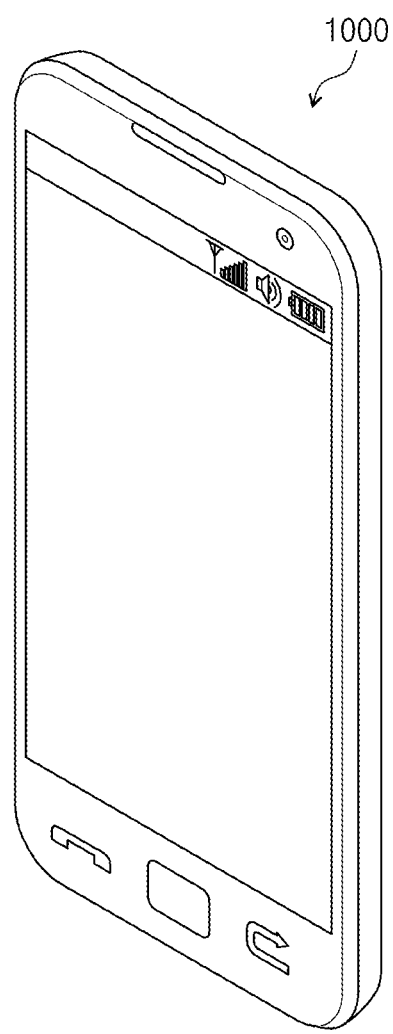
FIG. 13 is a perspective view illustrating an electronic system including at least one of semiconductor packages according to example embodiments of inventive concepts.

FIG. 13 is a perspective view illustrating an electronic system including at least one of semiconductor packages according to example embodiments of inventive concepts.

Referring to FIG. 13, semiconductor packages according to example embodiments of inventive concepts may be included in an electronic system 1000, for example, a smart phone. The semiconductor packages according to example embodiments of inventive concepts may have the advantages which are capable of scaling down and/or realizing high performance. The electronic system including the semiconductor packages according to example embodiments is not limited to the smart phone. For example, the semiconductor packages according to example embodiments may be applicable to a mobile electronic product, a laptop computer, a portable computer, a portable multimedia player (PMP), an MP3 player, a camcorder, a web tablet, a wireless phone, a navigator or a personal digital assistant (PDA).

Figure 14:
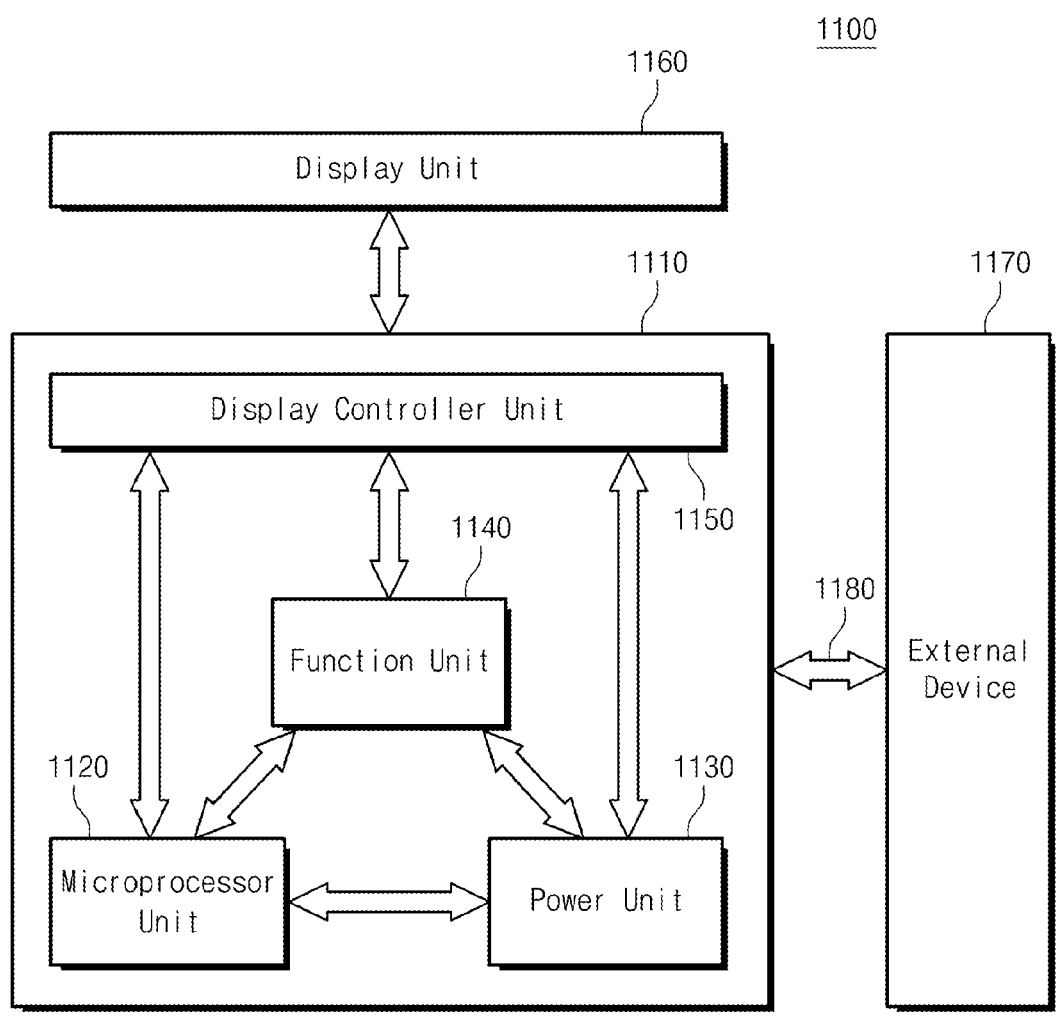
FIG. 14 is a schematic block diagram illustrating an electronic system including at least one of semiconductor packages according to example embodiments of inventive concepts.

FIG. 14 is a schematic block diagram illustrating an electronic system including at least one of semiconductor packages according to example embodiments of inventive concepts.

Referring to FIG. 14, the semiconductor packages 101, 110 and 111 described above may be included in an electronic system 1100. The electronic system 1100 may include a body 1110, a microprocessor unit 1120, a power unit 1130, a function unit 1140 and a display control unit 1150. The body 1110 may include a set board formed of a printed circuit board (PCB), and the microprocessor unit 1120, the power unit 1130, the function unit 1140 and the display control unit 1150 may be mounted on and/or in the body 1110.

The power unit 1130 may receive an electric power having a certain voltage from an external battery (not shown) and may generate a plurality of output power signals having different voltages, and the output power signals may be supplied to the microprocessor unit 1120, the function unit 1140 and the display control unit 1150.

The microprocessor unit 1120 may receive one of the output power signals from the power unit 1130 to control the function unit 1140 and the display unit 1160. The function unit 1140 may operate so that the electronic system 1100 executes one of diverse functions. For example, in the event that the electronic system 1100 is a mobile phone, the function unit 1140 may include various components which are capable of executing functions of the mobile phone, for example, a function of dialing, a function of outputting image signals to the display unit 1160 during communication with an external device 1170, and a function of outputting audio signals to speakers during communication with an external device 1170. Further, when the electronic system 1100 includes a camera, the function unit 1140 may correspond to a camera image processor CIP. Moreover, if the electronic system 1100 is connected to a memory card to increase a memory capacity, the function unit 1140 may correspond to a memory card controller. The function unit 1140 may communicate with the external device 1170 through a communication interface 1180 by wireless or cable. Furthermore, in the event that the electronic system 1100 needs a universal serial bus (USB) for function expansion, the function unit 1140 may be an interface controller. The package-on-package devices described above may be used in at least one of the microprocessor unit 1120 and the function unit 1140.

Figure 15:
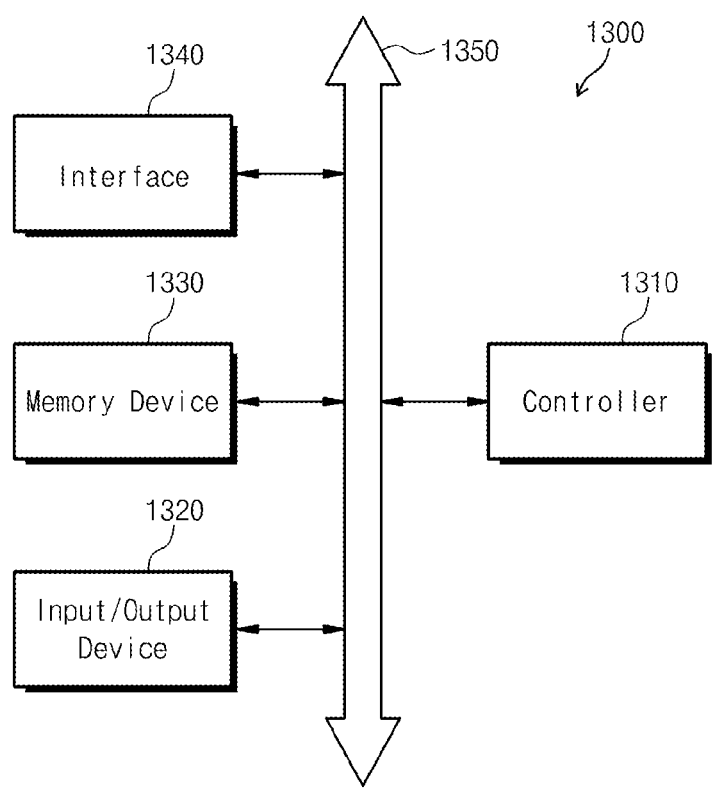
FIG. 15 is a block diagram illustrating an example of electronic systems including semiconductor packages according to example embodiments of inventive concepts.

FIG. 15 is a block diagram illustrating an example of electronic systems including semiconductor packages according to example embodiments of inventive concepts.

Referring to FIG. 15, an electronic system 1300 according to an example embodiment may include a controller 1310, an input/output (I/O) device 1320, a memory device 1330 and a data bus 1350. At least two of the controller 1310, the I/O device 1320 and the memory device 1330 may communicate with each other through the data bus 1350. The data bus 1350 may correspond to a path through which electrical signals are transmitted. The controller 1310 may include at least one of a microprocessor, a digital signal processor, a microcontroller and a logic device. The logic device may have a similar function to any one of the microprocessor, the digital signal processor and the microcontroller. The controller 1310 and/or the memory device 1330 may include at least one of the package-on-package devices described in the above embodiments. The I/O device 1320 may include at least one of a keypad, a keyboard and a display device. The memory device 1330 may store data and/or commands executed by the controller 1310. The memory device 1330 may include a volatile memory device and/or a nonvolatile memory device. For example, the memory device 1330 may include a flash memory device to which the package techniques according to the embodiments are applied. The flash memory device may constitute a solid state disk (SSD). In this case, the solid state disk including the flash memory device may stably store a large capacity of data. The electronic system 1300 may further include an interface unit 1340. The interface unit 1340 may transmit data to a communication network or may receive data from a communication network. The interface unit 1340 may operate by wireless or cable. For example, the interface unit 1340 may include an antenna for wireless communication or a transceiver for cable communication. Although not shown in the drawings, the electronic system 1300 may further include an application chipset and/or a camera image processor.

According to example embodiments of inventive concepts, a package-on-package device may include memory chips that are provided side-by-side on a package substrate. This makes it possible to reduce a thickness of the package-on-package device. Further, data and command pads of a logic chip may be located to be adjacent to data and command pads of the memory chips. Accordingly, a routing distance between pads can be contracted and thus signal delivery speed can be improved. This makes it possible to improve an operation speed of the device.

While example embodiments of inventive concepts have been particularly shown and described, it will be understood by one of ordinary skill in the art that variations in form and detail may be made therein without departing from the spirit and scope of the attached claims.

What is claimed is:

1. A package-on-package device, comprising: a first semiconductor package including a first package substrate and a logic chip on the first package substrate; and a second semiconductor package on the first semiconductor package, the second semiconductor package including a second package substrate and first and second memory chips mounted side-by-side on a top surface of the second package substrate, wherein the logic chip includes first and second data logic pads, the first and second data logic pads configured to communicate data signals and electrically connected to the first and second memory chips, respectively, and the first and second data logic pads are adjacent to one sidewall or opposite two facing sidewalls of the logic chip, wherein the first and second memory chips includes first and second memory pads which are electrically connected to first conductive patterns on the top surface of the second package substrate via first and second wires.

2. The device of claim 1, wherein the first and second memory chips further comprise:
first and second data memory pads and configured to communicate the data signals and corresponding to the first and second data logic pads, respectively, and
the first and second data memory pads are on same sides of the device as the first and second data logic pads, respectively.

3. The device of claim 2, wherein the logic chip further comprises:
first and second command logic pads configured to communicate command signals and electrically connected to the first and second memory chips, respectively, and
the first and second command logic pads are adjacent to a second sidewall of the logic chip or at a center of the logic chip, where the first and second data logic pads are adjacent to a first sidewall of the logic chip and the second sidewall is a sidewall of the logic chip facing the first sidewall.

4. The device of claim 3, wherein the first and second memory chips further comprise:
first and second command memory pads configured to communicate the command signals and corresponding to the first and second command logic pads, respectively, and
the first and second command memory pads are on same sides of the device as the first and second command logic pads, respectively.

5. The device of claim 4, further comprising:
first and second command solder balls between the first and second package substrates to connect the first and second command logic pads electrically to the first and second command memory pads, respectively, and
wherein the first and second command solder balls are on same sides of the device as the first and second command logic pads, respectively.

6. The device of claim 5, further comprising:
first and second data solder balls between the first and second package substrates to connect the first and second data logic pads electrically to the first and second data memory pads, respectively,
wherein the first and second data solder balls are on same sides of the device as the first and second data logic pads, respectively.

7. The device of claim 6, wherein the first package substrate comprises:
a first package sidewall adjacent to the first data solder balls;
a second package sidewall adjacent to the first command solder balls, the first and second package sidewalls facing each other; and
third and fourth package sidewalls facing each other and connecting the first and second package sidewalls to each other,
wherein a number of solder balls adjacent to the first and second package sidewalls is smaller than a number of solder balls adjacent to the third and fourth package sidewalls.

8. The device of claim 6, wherein a number of the command solder balls is equivalent to or smaller than a number of the data solder balls.

9. The device of claim 1, further comprising:
third and fourth memory chips on the first and second memory chips, respectively,
wherein the third and fourth memory chips are of the same kind as the first and second chips, and
sidewalls of the third and fourth memory chips are vertically aligned to those of the first and second memory chips, respectively.

10. The package-on-package device of claim 4, wherein the first and second data logic pads are closer to the first and second data memory pads, respectively, than the first and second command logic pads.

11. The package-on-package device of claim 10, wherein the first and second command logic pads are closer to the first and second command memory pads, respectively, than the first and second data logic pads.

12. The package-on-package device of claim 1, wherein at least one of the first data logic pads does not overlap the first memory chip in top plan view, and
at least one of the second data logic pads does not overlap the second memory chip in top plan view.

13. A package-on-package device, comprising: a first semiconductor package including a first package substrate and a logic chip having a first set of pads and a second set of pads, the first set at a first side of the device and configured for a first signal type, the second set at a second side of the device and configured for a second signal type, the first signal type being different from the second signal type; and a second semiconductor package on the first semiconductor package, the second semiconductor package including a second package substrate and first and second memory chips having a third set of pads and a fourth set of pads mounted on a top surface of the second package substrate, the third set configured for the first signal type and on a same side of the device as the first set, the fourth set configured for the second signal type and on a same side of the device as the second set wherein the first and third sets of pads are configured to communicate data signals and the second and fourth sets of pads are configured to communicate command signals, wherein the third set of pads and the fourth set of pads are electrically connected to first conductive patterns on the top surface of the second package substrate via first and second wires.

14. The device of claim 13, wherein the logic chip further includes a fifth set of pads, the fifth set configured to communicate the command signals and being on a same side of the device as the first set and adjacent to the first set.

15. The device of claim 14, wherein the logic chip further includes a sixth set of pads, the sixth set configured to communicate the data signals and being on a same side of the device as the second set and adjacent to the second set.

16. The device of claim 13, further comprising:
command solder balls between the first and second semiconductor packages to connect the second set electrically to the fourth set, respectively, and
wherein the command solder balls are on a same side of the device as the second set and the fourth set.

17. The device of claim 16, further comprising:
data solder balls between the first and second semiconductor packages to connect the first set electrically to the third set,
wherein the data solder balls are on a same side of the device as the first set and the third set.

18. The device of claim 13, wherein the first and second memory chips are mounted side-by-side.

19. The package-on-package device of claim 13, wherein the first set of pads is closer to third set of pads, respectively, than the second set of pads, and the second set of pads is closer to the fourth set of pads than the first set of pads.

* * * * *